(12) United States Patent
Harada et al.

(10) Patent No.: US 6,758,926 B2
(45) Date of Patent: Jul. 6, 2004

(54) METHOD FOR PRODUCING MULTILAYER CERAMIC SUBSTRATE

(75) Inventors: Hideyuki Harada, Omihachiman (JP); Hirofumi Sunahara, Moriyama (JP)

(73) Assignee: Murata Manufacturing Co. Ltd. (JP)

( * ) Notice: Subject to any disclaimer, the term of this patent is extended or adjusted under 35 U.S.C. 154(b) by 31 days.

(21) Appl. No.: 10/096,874

(22) Filed: Mar. 14, 2002

(65) Prior Publication Data

US 2002/0134488 A1 Sep. 26, 2002

(30) Foreign Application Priority Data

Mar. 23, 2001 (JP) .......................... 2001-084487

(51) Int. Cl.$^7$ .................. B32B 31/26; H01K 3/46
(52) U.S. Cl. .................. 156/89.11; 156/489.12; 156/289
(58) Field of Search ................... 156/89.11, 89.12, 156/89.16, 289; 264/610; 29/851

(56) References Cited

U.S. PATENT DOCUMENTS

| | | | | |
|---|---|---|---|---|
| 4,920,640 A | * | 5/1990 | Enloe et al. | 29/852 |
| 5,435,875 A | * | 7/1995 | Saitoh et al. | 156/245 |
| 5,643,818 A | * | 7/1997 | Sachdev et al. | 134/1 |
| 5,676,788 A | * | 10/1997 | Natarajan et al. | 156/285 |
| 5,772,837 A | * | 6/1998 | Natarajan et al. | 156/497 |

FOREIGN PATENT DOCUMENTS

| | | | |
|---|---|---|---|
| GB | 2 222 800 | | 3/1990 |
| JP | 6-224557 | * | 8/1994 |
| JP | 06-224559 A1 | | 8/1994 |
| JP | 7-142628 | * | 6/1995 |
| JP | 7-193163 | * | 7/1995 |
| JP | 7-245359 | * | 9/1995 |
| JP | 08-162769 A1 | | 6/1996 |
| JP | 08-245268 | * | 9/1996 |
| JP | 08-245268 A1 | | 9/1996 |
| JP | 09-039160 A1 | | 2/1997 |
| JP | 09-181449 A1 | | 7/1997 |
| JP | 9283928 | | 10/1997 |
| JP | 2000-127123 | * | 5/2000 |

OTHER PUBLICATIONS

UK Search Report dated Aug. 9, 2002.

* cited by examiner

*Primary Examiner*—Curtis Mayes
(74) *Attorney, Agent, or Firm*—Dickstein, Shapiro, Morin & Oshinsky, Ltd.

(57) ABSTRACT

A method for fabricating a multilayer ceramic substrate having a cavity with multi-steps therein for mounting an electronic component is provided. A block is inserted into a lower cavity segment of the cavity formed in a green sheet laminate to be the multilayer ceramic substrate, wherein the block has substantially the same three-dimensional shape as that of the cavity segment and has a height equal to or larger than the depth of the cavity segment. Thus, the pressing step is performed in a state such that the cavity has an apparent single step.

20 Claims, 2 Drawing Sheets

METHOD FOR PRODUCING MULTILAYER CERAMIC SUBSTRATE

BACKGROUND OF THE INVENTION

1. Field of the Invention

The present invention relates to production methods for producing multilayer ceramic substrates, and in particular relates to a method for producing a multilayer ceramic substrate having a cavity with multi-steps for mounting and housing an electronic component.

2. Description of the Related Art

In recent years, there has been a growing need for further reduction in size and weight, further enhanced multi-functions, higher reliability and the like, of electronic devices, and thus a need for improving technologies for mounting electronic components on a substrate exists. Most typically, an effective way of improving the mounting technologies is to achieve a high wiring density of the substrate.

To address high wiring density of such a substrate, a multilayer ceramic substrate which is fabricated by stacking, pressing and then firing a plurality of green ceramic sheets, each having a printed conductive film and the like thereon, has been developed.

In order to achieve a reduction in the size and thickness of the multilayer ceramic substrate, it is effective to form a cavity for mounting an electronic component in the multilayer ceramic substrate. When such a cavity is formed so as to have multi-steps, that is, when the cavity is formed so as to have at least a first cavity segment and a second cavity segment communicating with the bottom face of the first cavity segment, the bottom face of the first cavity segment can be used, for example, as a region for forming a conductive pad for wire-bonding an electronic component while the electronic component is housed in the second cavity segment.

However, as a result of firing during the manufacture of the substrate, a multilayer ceramic substrate having such a cavity with multi-steps often encounters such problems in that undesirable deformation or fracture develops at the periphery of the cavity, and a crack occurs at the end of the bottom face of the cavity, though this is not as noticeable when the multilayer ceramic substrate has a cavity with a single step.

The above problems are assumed to arise as a result of residual stress at a specific portion of a green sheet laminate. That is to say, when the green sheet laminate to be a multilayer ceramic substrate is pressed before sintering, it is difficult to put uniform pressure on the entire green sheet laminate because a relatively uneven cavity with multi-steps exists in the laminate. This results in deterioration of the flatness of the stepped bottom face of the cavity or in undesirable deformation of the cavity.

To solve the above problems, Japanese Unexamined Patent Application Publication No. 9-39160 discloses a pressing step which is performed such that a green sheet laminate having a cavity with multi-steps is vacuum-packed while being sandwiched by a pair of rubber sheets and is pressed isotropically in a stationary fluid.

Japanese Unexamined Patent Application Publication No. 9-181449 discloses a pressing step which is performed such that a green sheet laminate having a cavity with multi-steps is pressed by an elastic member having a projection with multi-steps, the projection having the same shape as the cavity with multi-steps.

Japanese Unexamined Patent Application Publication No. 6-224559 discloses a method for fabricating a green sheet laminate that is pressed entirely and that has a cavity with multi-steps. The method comprises the steps of placing a rigid plate, which has a through-hole equal to or slightly smaller than the opening of the cavity, on the green sheet laminate and pressing the green sheet laminate from an elastic member via the rigid plate by exerting a pressure thereon at every step of the cavity.

However, even when the method stated in Japanese Unexamined Patent Application Publication No. 9-39160 is adopted, one of the rubber sheets intrudes into the cavity in the pressing step, resulting in a stress on the stepped bottom face of the cavity and an undesirable deformation of the bottom face. Accordingly, this sometimes makes it difficult for the green sheet laminate to maintain the flatness of the bottom face of the cavity. In addition, intrusion of the rubber sheet may cause the cavity to widen its radial dimension and, as a result, a deterioration in its dimensional accuracy can occur.

The method stated in Japanese Unexamined Patent Application Publication No. 9-181449 requires preparing elastic members corresponding to shapes of the cavities to be formed in the multilayer ceramic substrate. Furthermore, the pressing step requires aligning the cavity having multi-steps formed in the green sheet laminate with the projection having multi-steps formed in the elastic member; however, this alignment is not so easy, and accordingly hampers attempts to increase the efficiency of the step. With this view, it is expected that the method according to the Japanese Unexamined Patent Application Publication No. 9-181449 will entail an increased production cost of the multilayer ceramic substrate.

Japanese Unexamined Patent Application Publication No. 6-224559 requires pressing the green sheet laminate at every step of the cavity, thus giving rise to a problem of relatively low production efficiency, although the flatness of the stepped bottom face of the cavity is maintained and the radial dimension of the cavity does not widen.

SUMMARY OF THE INVENTION

Accordingly, it is an object of the present invention to provide a method for producing a multilayer ceramic substrate having a cavity with multi-steps therein.

The present invention, in brief, has a feature such that an appropriate block is inserted in a portion of a cavity with multi-steps so as to allow the cavity to have an apparent single step and thus to perform a pressing step.

More particularly, a method for producing a multilayer ceramic substrate according to the present invention comprises the steps of (a) fabricating a green sheet laminate by laminating a plurality of green ceramic sheets, a stack of predetermined green ceramic sheets having through-holes therein so as to provide a cavity in the green sheet laminate, the cavity having an opening at one end face of the green sheet laminate in a lamination direction thereof and comprising at least a first cavity segment and a second cavity segment communicating with the bottom face of the first cavity segment, (b) preparing a block having substantially the same three-dimensional shape as that of the cavity with the first cavity segment excluded and having a height equal to or larger than the depth of the cavity with the first cavity segment excluded, (c) inserting the block into the cavity with the first cavity segment excluded, (d) pressing the green sheet laminate in the lamination direction thereof, and (e) firing the green sheet laminate.

The foregoing block can be made from any material as long as the material has characteristics to maintain the formation of cavity to a certain extent in the step of pressing the green sheet laminate. The block may comprise an inorganic material which does not sinter at the sintering temperature of the ceramic material contained in the green ceramic sheet, or a hardening resin that burns out at the sintering temperature of the ceramic material contained in the green ceramic sheet.

The pressing step according to the present invention is preferably performed as follows. It may comprise the substeps of preparing an elastic member and preparing a rigid plate having a through-hole that is equal to or slightly smaller than the opening of the cavity. While the through-hole of the rigid plate is aligned with the opening of the cavity, the pressing step is performed such that the rigid plate is placed on the green sheet laminate and a pressure is exerted on the green sheet laminate from the elastic member via the rigid plate.

Hydrostatic pressing is preferably applied in the pressing step. In this case, the green sheet laminate, the rigid plate and the elastic member are put into a vacuum-packed state in a packing container.

The cavity formed in the green sheet laminate according to the present invention may have three steps or more. For example, the cavity may further comprise a third cavity segment communicating with the bottom face of the second cavity segment.

The present invention is directed to the production mention for producing a multilayer ceramic substrate by using a so-called non-shrinkage process. In this case, the production method according to the present invention may further comprise the step of preparing a shrinkage-inhibiting inorganic material which does not sinter at the sintering temperature of the ceramic material contained in the green ceramic sheet, wherein the fabricating step includes providing shrinkage-inhibiting layers comprising the shrinkage-inhibiting inorganic material so as to cover both end faces of the green sheet laminate in the lamination direction, while one of the shrinkage-inhibiting layers has a through-hole therein so as to expose the opening of the cavity. Then, the firing step is performed under the condition that only the ceramic material contained in the green ceramic sheet sinters.

In the preferred embodiments as described above, the block may comprise the shrinkage-inhibiting inorganic material.

DESCRIPTION OF THE PREFERRED EMBODIMENTS

Figure 1:
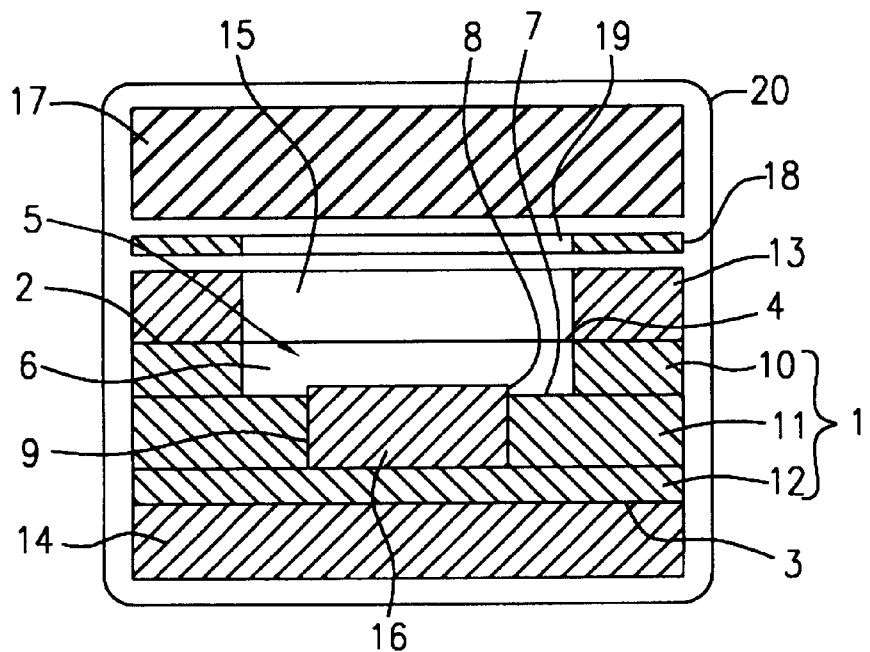
FIG. 1 is a sectional view illustrating a pressing step performed during a production of a multilayer ceramic substrate according to a first embodiment of the present invention.

FIG. 1 is a sectional view illustrating a pressing step performed during a production of a multilayer ceramic substrate according to a first embodiment of the present invention. A green sheet laminate 1 obtained during the production of the multilayer substrate is shown in FIG. 1.

The green sheet laminate 1 has a first end face 2 and a second end face 3 at its ends in the lamination direction thereof, and has a cavity 5 having an opening 4 at the first end face 2. The cavity 5 has a first cavity segment 6 and a second cavity segment 9 communicating with a bottom face 7 of the first cavity segment 6.

A plurality of the cavities 5 as described above may be formed in a dispersed manner in the green sheet laminate 1.

In order to fabricate the green sheet laminate 1, a first green ceramic sheet 10 having a through-hole forming the first cavity segment 6, a second green ceramic sheet 11 having a relatively small through-hole forming the second cavity segment 9, and a third green ceramic sheet 12 having no through-hole are prepared.

Though not shown in the drawing, each of these green ceramic sheets 10 to 12 may be formed by laminating a plurality of green ceramic sheets so as to provide a desired thickness.

The green ceramic sheets 10 to 12 may comprise a glass ceramic containing a glass ingredient.

The green sheet laminate 1 is obtained by laminating the first, the second and the third green ceramic sheets 10 to 12 as described above. More particularly, the second green ceramic sheet 11 is stacked on the third green ceramic sheet 12 and further the first green ceramic sheet 10 is stacked on top of them.

Though not shown in the drawing, the green sheet laminate 1 has an internal conductive film and a via-hole conductor therein and has external conductive films on the end faces 2 and 3.

In addition, a shrinkage-inhibiting inorganic material which does not sinter at the sintering temperature of the ceramic material contained in the green ceramic sheets 10 to 12 is prepared. When the green ceramic sheets 10 to 12 comprise a glass ingredient as described above, for example, an alumina powder may be used as a shrinkage-inhibiting inorganic material.

A first shrinkage-inhibiting layer 13 and a second a shrinkage-inhibiting layer 14 using the foregoing shrinkage-inhibiting inorganic material are provided so as to cover the first end face 2 and the second end face 3 of the green sheet laminate 1, respectively. The first shrinkage-inhibiting layer 13 on the first end face 2 has a through-hole 15 therein so as to expose the opening 4 of the cavity 5. Preferably, the through-hole 15 has substantially the same shape as that of the opening 4 of the cavity 5.

The foregoing shrinkage-inhibiting layers 13 and 14 can be provided such that inorganic material sheets are made by forming a slurry containing a shrinkage-inhibiting inorganic material into sheets and are stacked together with the green ceramic sheets 10 to 12 so as to abut against the end faces 2 and 3, respectively. In this case, the necessary depth of each of the shrinkage-inhibiting layers 13 and 14 can be adjusted by changing the number of the foregoing inorganic material sheets to be laminated.

Then, a block 16 is prepared and inserted into the second cavity segment 9, wherein the block 16 has substantially the same three-dimensional shape as that of the cavity 5 of the green sheet laminate 1 with the first cavity segment 6 excluded, that is, in this embodiment, substantially the same as that of the second cavity segment 9, and also has a height at least equal to the depth of the second cavity segment 9.

When the block 16 is inserted, a mounting machine for mounting chip components on a wiring board is applied, for example.

By way of example, the block 16 is designed to have surface dimensions of 1.98 mm×1.98 mm and a depth of 210 µm when the green sheet laminate 1 has surface dimensions of 100 mm×100 mm and a thickness of 1 mm, and, with respect to the dimensions of the cavity 5, the first cavity segment 6 has surface dimensions of 3 mm×3 mm and a depth of 300 µm while the second cavity segment 9 has surface dimensions of 2 mm×2 mm and a depth of 200 µm.

The dimensions as determined above allow the block 16 to be easily inserted into the second cavity segment 9 because a slight clearance remains between the block 16 and the inner surface of the second cavity segment 9. Furthermore, the block 16 slightly projects from an opening 8 of the second cavity segment 9. As long as the block 16 is preset to have a height greater than the depth of the second cavity segment 9 as described above, the block 16 can be fabricated efficiently since it is not necessary to determine the height of the block 16 accurately.

Preferably, the block 16 comprises the same inorganic material as the shrinkage-inhibiting inorganic material contained in the foregoing shrinkage-inhibiting layers 13 and 14. In order to maintain a formation serving as the block 16, the inorganic material is obtained such that a binder and the like are added to a powder of the inorganic material to form a paste and the paste is cut into a piece having the desired dimensions.

The block 16 may comprise an inorganic material which does not sinter at the sintering temperature of the ceramic material contained in the green ceramic sheets 10 to 12 and which is different from the shrinkage-inhibiting inorganic material. Alternatively, the block 16 may be made from a sintered compact comprising such an inorganic material.

Then, the green sheet laminate 1, having the cavity as an apparent single step as a result of inserting the block 16 as described above, is pressed in the lamination direction thereof. An elastic member 17 and a rigid plate 18 are used in this pressing step.

The elastic member 17 is made from, for example, a silicon rubber having a thickness of 10 mm.

The rigid plate 18 has a through-hole 19 equal to or slightly smaller than the opening 4 of the cavity 5, and is made from, for example, a rigid member such as metal, resin or ceramic. The rigid plate 18 has a thickness of about 1 mm, for example.

The rigid plate 18 is placed on the green sheet laminate 1 while the through-hole 19 is aligned with the opening 4 of the cavity 5. According to the first embodiment, the rigid plate 18 is placed so as to abut against the first shrinkage-inhibiting layer 13. Then, while being vacuum-packed in a plastic bag 20 as a packing container, the green sheet laminate 1, the shrinkage-inhibiting layers 13 and 14, the rigid plate 18 and the elastic member 17 are put in a water tank of a hydrostatic pressing machine so as to undergo a hydrostatic pressure of 500 kgf/cm² at a temperature of 60° C., for example.

In the foregoing pressing step, first of all, the first end face 2 of the green sheet laminate 1 is kept flat by the rigid plate 18 via the first shrinkage-inhibiting layer 13 abutting against the rigid plate 18. Also, the presence of the block 16 keeps the end face 7 of the first cavity segment 6 flat and makes it unlikely that the end face 7 of the first cavity segment 6 and the side faces of the second cavity segment 9 are affected by a lateral pushing force, thereby allowing the cavity 5 to have high dimensional accuracy.

When the block 16 is made from a molded member formed from the paste of inorganic material powder as described above, the block 16 is deformed so as to decrease its thickness in the pressing step, and thus the clearance between the block 16 and the inner surface of the second cavity segment 9 is eliminated, thereby allowing the block 16 to accomplish the above described function more effectively.

Next, the green sheet laminate 1 is taken out from the bag 20 and undergoes a firing step without pressing, which may include degreasing for four hours at a temperature of 450° C. and firing for 20 minutes at a temperature of 900° C., for example.

In the foregoing firing step, the shrinkage-inhibiting layers 13 and 14 do not shrink substantially because the shrinkage-inhibiting inorganic material contained in the shrinkage-inhibiting layers 13 and 14 does not sinter substantially. Accordingly, in the firing step, the green ceramic sheets 10 to 12 constituting the green sheet laminate 1 shrink only in the depth direction thereof, but do not substantially shrink in a direction along the principal planes thereof because they are constrained by the shrinkage-inhibiting layers 13 and 14. Block 16 does not constrain the foregoing green ceramic sheet 10–12 to shrink in the depth direction thereof in the firing step.

The green sheet laminate 1 having undergone the sintering as described above provides the desired multilayer ceramic substrate. Usually, the shrinkage-inhibiting layers 13 and 14 and also the block 16 are removed from the multilayer ceramic substrate obtained as described above. In the firing step, the shrinkage-inhibiting layers 13 and 14 do not sinter substantially, and the block 16 also does not sinter substantially if the block 16 comprises the foregoing inorganic material. This allows the shrinkage-inhibiting layers 13 and 14, and the block 16 to be removed easily. However, when the block 16 is made from a sintered compact, it is preferable to remove the block 16 before the firing step.

Figure 2:
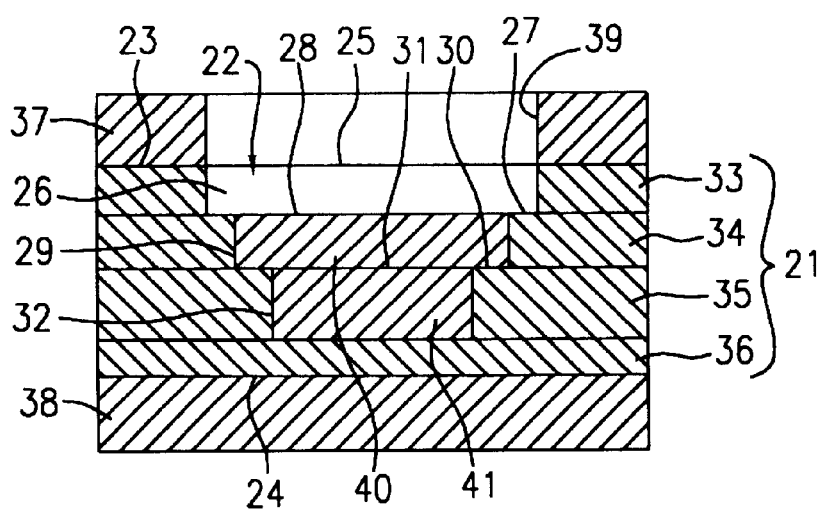
FIG. 2 is a sectional view illustrating a green sheet laminate 21 which is to be pressed and which is obtained during the production of the multilayer ceramic substrate according to a second embodiment of the present invention.

FIG. 2 is a sectional view illustrating a green sheet laminate 21 obtained during the production of the multilayer ceramic substrate according to a second embodiment of the present invention. The green sheet laminate 21 shown in FIG. 2 is different from the green sheet laminate 1 shown in FIG. 1 such that the green sheet laminate 21 has a cavity 22 with three steps.

More particularly, the green sheet laminate 21 has a first end face 23 and a second end face 24, and an opening 25 at the first end face 23. The cavity 22 comprises a first cavity segment 26, a second cavity segment 29 communicating with a bottom face 27 of the first cavity segment 26, and a third cavity segment 32 communicating with a bottom face 30 of the second cavity segment 29.

The green sheet laminate 21 is obtained by laminating a first green ceramic sheet 33 having a through-hole forming the first cavity segment 26, a second green ceramic sheet 34 having a through-hole forming the second cavity segment 29, a third green ceramic sheet 35 having a through-hole forming the third cavity segment 32 and a fourth green ceramic sheet 36 having no through-hole.

A first shrinkage-inhibiting layer 37 and a second a shrinkage-inhibiting layer 38 are provided so as to cover the first end face 23 and the second end face 24 of the green sheet laminate 21, respectively. The first shrinkage-inhibiting layer 37 has a through-hole 39 therein so as to expose the opening 25 of the cavity 22.

Prior to pressing the green sheet laminate 21 in the lamination direction, a block 40 and a block 41 are inserted into the cavity 22 with the first cavity segment 26 excluded, that is, into the second and the third cavity segments 29 and 32 in the second embodiment. The block 40 has substantially the same three-dimensional shape as that of the second cavity segment 29, and the block 41 has substantially the same three-dimensional shape as that of the third cavity segment 32.

The blocks 40 and 41 have heights of at least the depths of the second and the third cavity segments 29 and 32, respectively. In particular, the block 41 inserted into the third cavity segment 32 preferably has a height equal to the depth of the third cavity segment 32.

Since the pressing step, the firing step, and so forth, which are performed after the green sheet laminate 21 is obtained, are substantially the same as those for the green sheet laminate 1, a description thereof will be omitted.

Figure 3:
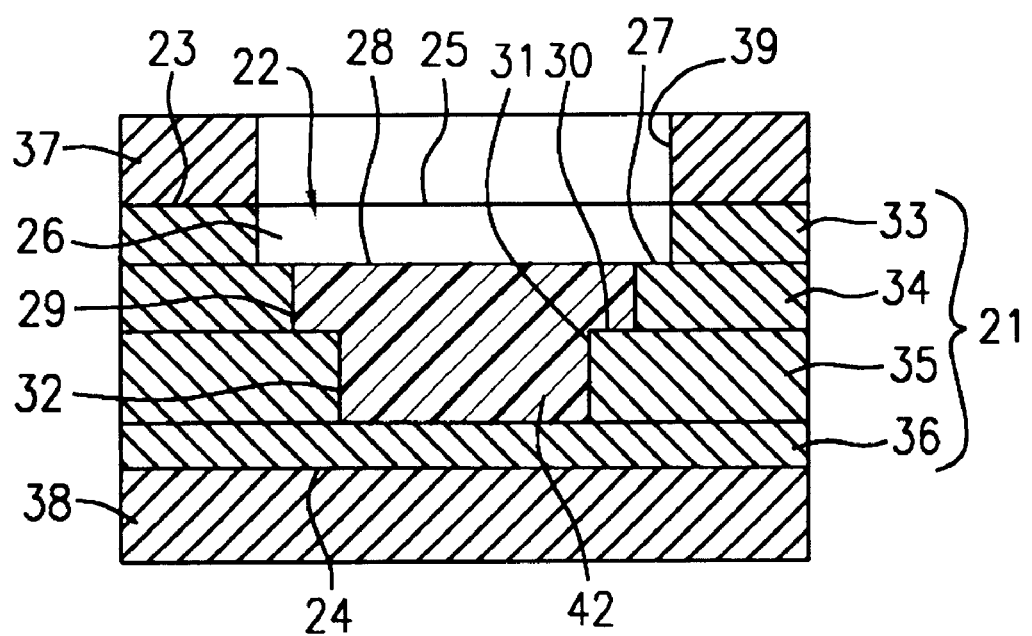
FIG. 3 is a sectional view illustrating the green sheet laminate 21 which is to be pressed and is obtained during the production of the multilayer ceramic substrate according to a third embodiment of the present invention.

FIG. 3 is a sectional view illustrating the green sheet laminate 21 obtained during the production of the multilayer ceramic substrate according to a third embodiment of the present invention.

Since the green sheet laminate 21, the shrinkage-inhibiting layers 37 and 38, and the configuration related to them are substantially the same as those shown in FIG. 2, corresponding elements are given like reference numerals and repetitive descriptions will be omitted.

A block 42 made from a hardened resin that burns out at the sintering temperature of the ceramic material contained in the green sheets 33 to 36 is inserted into the second and the third cavity segments 29 and 32 of the green sheet laminate 21 shown in FIG. 3.

Preferably, such a hardened resin is poured into the second and the third cavity segments 29 and 32 prior to hardening and is hardened after pouring. To accomplish this, the green sheet laminate 21 preferably has excellent adhesiveness between adjacent ones among the green ceramic sheets 33 to 36. For example, the green sheet laminate 21 is temporarily pressed at every lamination step of the green ceramic sheets 33 to 36, or the green sheet laminate 21 is temporarily pressed at a relatively low pressure after lamination.

For example, a thermosetting resin that sets at a temperature of about 60° C. is used as a hardening resin. This resin is set by putting it in an oven set at a temperature of about 60° C. Alternatively, a photo-curing resin may be used as a hardening resin. This resin is cured by being irradiated with light. Alternatively, the hardening resin may be prepared in a shape different from those of the second and the third cavity segments 29 and 30, for example, as a spherical solid body. After being disposed in the cavity 22, this resin is softened, e.g., by heating, so as to adapt to the shapes of the second and the third cavity segments 29 and 30, and then is hardened while being kept in the adapted state.

Using the hardening resin as heretofore described substantially eases a problem of alignment accuracy which arises when a block is inserted, such as the block 16 shown in FIG. 1, or the blocks 40 and 41 shown in FIG. 2, each having a respective predetermined shape.

The pressing step, the firing step and so forth in the third embodiment shown in FIG. 3 are also performed in the same fashion as in the first embodiment shown in FIG. 1. The block 42 made from a hardening resin burns out in the firing step, thus requiring no separate step of removing this resin.

Although the present invention has been described in terms of the embodiments illustrated in the accompanying drawings, various other modifications are possible within the scope of the present invention.

For example, rigid pressing instead of hydrostatic pressing may be applied in the pressing step.

The cavity formed in the green sheet laminate may have four steps or more.

Although, the shrinkage-inhibiting layers 13 and 14 as well as the shrinkage-inhibiting layers 37 and 38 are provided in relation to the green sheet laminates 1 and 21, respectively, and also a sintering step including a so-called non-shrinkage process is applied in the embodiments shown in the drawings, firing may be applied without providing these shrinkage-inhibiting layers.

As described above, before a green sheet laminate having a cavity therein comprising at least a first cavity segment and a second cavity segment communicating with the bottom face of the first cavity segment is pressed in the lamination direction thereof, a block is prepared having substantially the same three-dimensional shape as that of a cavity with the first cavity segment excluded and also having a height which is at least the depth of the cavity with the first cavity segment excluded in the present invention. Then, the block is inserted into the cavity with the first cavity segment excluded. Accordingly, this arrangement reduces the risk of deformation of the cavity in the pressing step, in particular, deformation in the bottom face of each cavity segment, thus producing a multilayer ceramic substrate having a cavity accurately therein.

When a block comprising an inorganic material that does not sinter at the sintering temperature of the ceramic material contained in the green ceramic sheets which constitute the green sheet laminate is used in the present invention, the block can be easily removed even after firing of the green sheet laminate because the block does not sinter substantially.

Also, when a block made from a thermosetting resin that burns out at the sintering temperature of the ceramic material contained in the ceramic green sheets is used, the block can be poured into the cavity prior to setting the thermosetting resin. This does not require highly accurate alignment when the block is inserted, and thus the inserting step is performed effectively and also an additional step for removing the block after sintering is eliminated since the block burns out.

When the pressing step in the present invention is performed so as to exert a pressure on the green sheet laminate from the elastic member via a rigid plate such that an elastic member and a rigid plate having a through-hole equal to or slightly small than an opening of the cavity are prepared and the rigid plate is placed on the green sheet laminate while the through-hole of the rigid plate is aligned with the opening of the cavity, the elastic member easily exerts a uniform pressure on the inside of the cavity while the rigid plate maintains the flatness of the end face of the green sheet laminate having the opening of the cavity therein. Thus, a higher quality multilayer ceramic substrate can be obtained.

The foregoing elastic member can be always used even if the shape of the cavity is modified. This leads to a reduced cost compared to the case in which elastic members having shapes matching those of the cavities are prepared, and also to avoiding the alignment problem.

When a pressing step is performed by applying hydrostatic pressing while the green sheet laminate, the rigid plate and the elastic member as heretofore described are vacuum-packed by using a packing container, a more uniform pressure can be exerted on the green sheet laminate.

When the present invention is applied to a so-called non-shrinkage process in which a sintering step is performed such that shrinkage-inhibiting layers containing a shrinkage-inhibiting inorganic material which does not sinter at the sintering temperature of the ceramic material contained in the green ceramic sheets are provided so as to cover the end faces of the green sheet laminate in the lamination direction thereof, the cavity becomes even deeper by an amount equal to the thickness of the shrinkage-inhibiting layer, thereby making it difficult to put a uniform pressure on the green sheet laminate. However, according to the present invention, the apparent depth of the cavity decreases by an amount equal to the thickness of the block since a block is inserted in the cavity, thereby making it easier to exert an isotropic pressure on the entire green sheet laminate.

In addition, applying the foregoing non-shrinkage process allows the multilayer ceramic substrate to have more accurate dimensions.

When such a non-shrinkage process is applied, configuring the block so as to comprise the shrinkage-inhibiting inorganic material contained in the shrinkage-inhibiting layers allows the foregoing advantage of containing the inorganic material to be maintained as it is, and also commonality of materials to be achieved so that a cost reduction can be expected.

What is claimed is:

1. A method for producing a multilayer ceramic substrate, comprising:

providing a green sheet laminate comprising a laminated stack comprising a plurality of green ceramic sheets, a portion of the green ceramic sheets having through-holes therein arranged so as to provide a cavity in the green sheet laminate, the cavity having an opening at one end face of the green sheet laminate in a lamination direction thereof, the cavity having a stepped cross-section and comprising a first cavity segment having a bottom face and a first lateral extent, and a second cavity segment communicating with the bottom face of the first cavity segment and having a depth and a second lateral extent, wherein the first lateral extent is greater than the second lateral extent;

providing a block having substantially the same three-dimensional shape as that of the second cavity segment and having a height equal to or larger than the depth of the second cavity segment;

inserting the block into the second cavity segment;

pressing the green sheet laminate in the lamination direction thereof; and firing the green sheet laminate;

wherein the block comprises a hardened resin that burns out at the sintering temperature of the ceramic material contained in the green sheet laminate.

2. The method according to claim 1, further comprising introducing said resin into said second cavity segment prior to the hardening thereof and then hardening said resin.

3. The method according to claim 1, further comprising the step of:

providing a pair of shrinkage-inhibiting layers comprising a shrinkage-inhibiting inorganic material which does not sinter at the sintering temperature of the ceramic material contained in the green sheet laminate, the shrinkage-inhibiting layers being arranged so as to cover both end faces of the green sheet laminate in the lamination direction, wherein one of the shrinkage-inhibiting layers has a through-hole therein which is disposed so as to expose the opening of the cavity.

4. The method according to claim 3, wherein the block comprises the shrinkage-inhibiting inorganic material.

5. A method for producing a multilayer ceramic substrate, comprising:

providing a green sheet laminate comprising a laminated stack comprising a plurality of green ceramic sheets, a portion of the green ceramic sheets having through-holes therein arranged so as to provide a cavity in the green sheet laminate, the cavity having an opening at one end face of the green sheet laminate in a lamination direction thereof, the cavity having a stepped cross-section and comprising a first cavity segment having a bottom face and a first lateral extent, and a second cavity segment communicating with the bottom face of the first cavity segment and having a depth and a second lateral extent, wherein the first lateral extent is greater than the second lateral extent;

providing a block having substantially the same three-dimensional shape as that of the second cavity segment and having a height equal to or larger than the depth of the second cavity segment;

inserting the block into the second cavity segment;

pressing the green sheet laminate in the lamination direction thereof; and firing the green sheet laminate;

wherein said pressing comprises providing a rigid plate having a through-hole which is equal to or slightly smaller than the opening of the cavity on the green sheet laminate and which is aligned with the opening of the cavity, and pressing by exerting pressure on the green sheet laminate from an elastic member via the rigid plate.

6. The method according to claim 5, wherein the pressing is effected by putting the green sheet laminate, the rigid plate, and the elastic member in a vacuum-packed state in a packing container and applying hydrostatic pressure.

7. The method according to claim 5, further comprising the step of:

providing a pair of shrinkage-inhibiting layers comprising a shrinkage-inhibiting inorganic material which does not sinter at the sintering temperature of the ceramic material contained in the green sheet laminate, the shrinkage-inhibiting layers being arranged so as to cover both end faces of the green sheet laminate in the lamination direction, wherein one of the shrinkage-inhibiting layers has a through-hole therein which is disposed so as to expose the opening of the cavity.

8. The method according to claim 7, wherein the block comprises the shrinkage-inhibiting inorganic material.

9. A method for producing a multilayer ceramic substrate comprising:

providing a green sheet laminate comprising a laminated stack comprising a plurality of green ceramic sheets, a portion of the green ceramic sheets having through-holes therein arranged so as to provide a cavity in the green sheet laminate, the cavity having an opening at one end face of the green sheet laminate in a lamination direction thereof, the cavity having a stepped cross-section comprising at least two steps and comprising a first cavity segment having a bottom face and a first lateral extent, a second cavity segment communicating with the bottom face of the first cavity segment and having a depth and a second lateral extent, wherein the first lateral extent is greater than the second lateral extent, and a third cavity segment communicating with the bottom face of the second cavity segment and having a depth and a third lateral extent, wherein the second lateral extent is greater than the third lateral extent;

providing a block having substantially the same three-dimensional shape as that of the combined second and third cavity segments and having a height equal to or larger than the depth of the second and third cavity segment;

inserting the block into the second and third cavity segments;

pressing the green sheet laminate in the lamination direction thereof; and firing the green sheet laminate.

10. The method according to claim 9, wherein the block comprises an inorganic material that does not sinter at the sintering temperature of the ceramic material contained in the green sheet laminate.

11. The method according to claim 9, wherein the block comprises a hardened resin that burns out at the sintering temperature of the ceramic material contained in the green sheet laminate.

12. The method according to claim 11, further comprising introducing said resin into said second cavity segment prior to the hardening thereof and then hardening said resin.

13. The method according to claim 9, further comprising the step of:

providing a pair of shrinkage-inhibiting layers comprising a shrinkage-inhibiting inorganic material which does not sinter at the sintering temperature of the ceramic material contained in the green sheet laminate, the shrinkage-inhibiting layers being arranged so as to cover both end faces of the green sheet laminate in the lamination direction, wherein one of the shrinkage-inhibiting layers has a through-hole therein which is disposed so as to expose the opening of the cavity, and effecting firing under the condition that only the ceramic material contained in the green ceramic sheet sinters.

14. The method according to claim 13, wherein the block comprises the shrinkage-inhibiting inorganic material.

15. The method according to claim 13, wherein said pressing comprises providing a rigid plate having a through-hole which is equal to or slightly smaller than the opening of the cavity on the green sheet laminate and which is aligned with the opening of the cavity, and pressing by exerting pressure on the green sheet laminate from an elastic member via the rigid plate.

16. The method according to claim 15, wherein the pressing is effected by putting the green sheet laminate, the rigid plate, and the elastic member in a vacuum-packed state in a packing container and applying hydrostatic pressure.

17. The method according to claim 16, wherein the block comprises an inorganic material that does not sinter at the sintering temperature of the ceramic material contained in the green sheet laminate.

18. The method according to claim 16, wherein the block comprises a hardened resin that burns out at the sintering temperature of the ceramic material contained in the green sheet laminate.

19. The method according to claim 18, further comprising introducing said resin into said second and third cavity segment prior to the hardening thereof and then hardening said resin.

20. The method according to claim 7, wherein said block has a height larger than the depth of the second and third cavity segments.

* * * * *